United States Patent [19]

Schwarz et al.

[11] Patent Number: 5,263,880

[45] Date of Patent: Nov. 23, 1993

[54] WIREBOND PIN-PLASTIC HEADER COMBINATION AND METHODS OF MAKING AND USING THE SAME

[75] Inventors: Dwight L. Schwarz; John A. Hearn; Mark E. Webster, all of Kokomo; Gregory L. Hall, Russiaville, all of Ind.

[73] Assignee: Delco Electronics Corporation, Kokomo, Ind.

[21] Appl. No.: 915,976

[22] Filed: Jul. 17, 1992

[51] Int. Cl.$^5$ .............................................. H05K 7/10
[52] U.S. Cl. ....................................... 439/733; 29/841; 174/52.2; 439/79; 439/936
[58] Field of Search ............... 439/733, 751, 869, 873, 439/587, 589, 936, 874, 79; 29/841, 855, 860; 361/394, 395, 399; 174/52.2, 52.3

[56] References Cited

U.S. PATENT DOCUMENTS

| | | | |
|---|---|---|---|
| 2,563,712 | 8/1951 | Frei | 439/589 |
| 3,040,287 | 6/1962 | Agron et al. | 439/589 |
| 3,671,920 | 6/1972 | Iantorno et al. | 439/751 |
| 4,072,378 | 2/1978 | Lockbrunner et al. | 361/388 |
| 4,131,331 | 12/1978 | Kendall, Jr. | 439/559 |
| 4,650,271 | 3/1987 | Forney, Jr. et al. | 439/874 |
| 4,879,630 | 11/1989 | Boucard et al. | 361/395 |
| 4,893,215 | 1/1990 | Urushiwara et al. | 361/395 |

FOREIGN PATENT DOCUMENTS 2753145 6/1979 Fed. Rep. of Germany ........ 439/79

Primary Examiner—Neil Abrams
Attorney, Agent, or Firm—Cary W. Brooks

[57] ABSTRACT

Disclosed is a wirebond pin having a star-shaped anchor, collar and paddle. The collar prevents passivation material, used to make a sealed semiconductor device, from leaking out of the package. The collar also helps to eliminate the resonant vibration of the pin during ultrasonic wirebonding at the paddle.

12 Claims, 4 Drawing Sheets

WIREBOND PIN-PLASTIC HEADER COMBINATION AND METHODS OF MAKING AND USING THE SAME

FIELD OF THE INVENTION

This invention relates to wirebond pins and more particularly to wirebond pins that are insertable and self-sealing in a plastic header.

BACKGROUND OF THE INVENTION

A variety of wirebond pins and electrical interconnects for both circuit board semiconductor devices and ceramic substrate semiconductor devices are known. For ultrasonic bonding, the structural design of the wirebond pin and/or the connector housing must be such as to avoid excessive resonant vibration. Failure to limit the vibration of the pin will result in poor wirebonding and reduced yields.

For ceramic substrate semiconductor devices, ultrasonic bonding of the pin connector is essential. This is because the connector pin cannot go through the ceramic substrate as is the case with circuit board semiconductor devices. Any attempt to attach a pin through the ceramic substrate may result in severe fracture or breakage of the substrate during assembly or the life of the part.

Further, where it is desirable to have a passivation layer over an integrated circuit formed on a substrate, it is essential that the connector pin form a seal in the connector housing such that the passivation material will not leak out during the assembly process.

In the manufacture of the plastic header, holes are formed in the plastic for receiving the wirebond pin. The holes will always have a diameter slightly larger than the shaft of the pin but smaller than the diameter of the anchor. As the pin is inserted into the plastic, the anchor must deform the plastic as it passes through it. The elastic memory of the plastic causes it to move back near its original position thus surrounding and sealing the anchor. However, there still is a circular gap between the shaft of the pin and the surface of the plastic defining the hole.

Heretofore, an additional step had to be performed to seal off the gap between the shaft of the pin and the surface defining the hole so that passivation material would not leak through the gap in the assembly process.

Thus, there is a need for a connector pin which limits the resonant vibration during ultrasonic wirebonding to an integrated circuit or hybrid substrate circuit. Further, there is a need for a wirebond pin/plastic header combination which provides an excellent seal preventing the leakage of a passivation material in the assembly of a sealed electronic device.

SUMMARY OF THE INVENTION

This invention includes an insertable and self-sealing single piece wirebond pin having an electrical contact portion, a star-shaped anchor portion, a collar for sealing the pin and improving ultrasonic wirebonding, and a paddle having a surface for wirebonding thereto. The wirebond pin may be inserted into a plastic header having a hole formed (i.e., molded in place) therein, wherein the star-shaped anchor secures the pin in position and the collar seals off any gap between the plastic header defining the hole and the shaft of the pin. The collar also helps to prevent resonant vibration of the pin during ultrasonic wirebonding to the paddle by acting as a supplemental support to the star shaped anchor. The header may be attached to a protective housing for a a semiconductor device or hybrid circuit. The semiconductor device or hybrid circuit may be fixed within the housing and may have a passivation material poured over the electronic device. The collar prevents the passivation material in its liquid form from flowing out of the gap between the plastic header and the shaft of the pin. A cap or cover may be placed on top of the housing to seal off the semiconductor device or hybrid circuit.

These and other features, objects and advantages will become apparent from the following detailed description, appended claims and drawings.

DETAILED DESCRIPTION

In the manufacture of a plastic header, it is to necessary to first form or mold holes in the plastic for receiving a wirebond pin. The wirebond pin is not constructed such that it can be forced through a solid plastic header without damaging the pin or reducing yields. The hole in the plastic header always has a diameter slightly larger than the shaft of the pin but smaller than the diameter of the anchor. This allows the pin to be forced into the plastic without a great amount of stress. As the pin is inserted into the plastic, the anchor deforms the plastic as it moves through it. The elastic memory of the plastic causes it to move back near its original position to surround and seal the anchor. However, there is still a circular gap between the shaft of the pin and the surface of the plastic defining the hole. The sealing of the gap is solved by the present invention.

Figure 5:
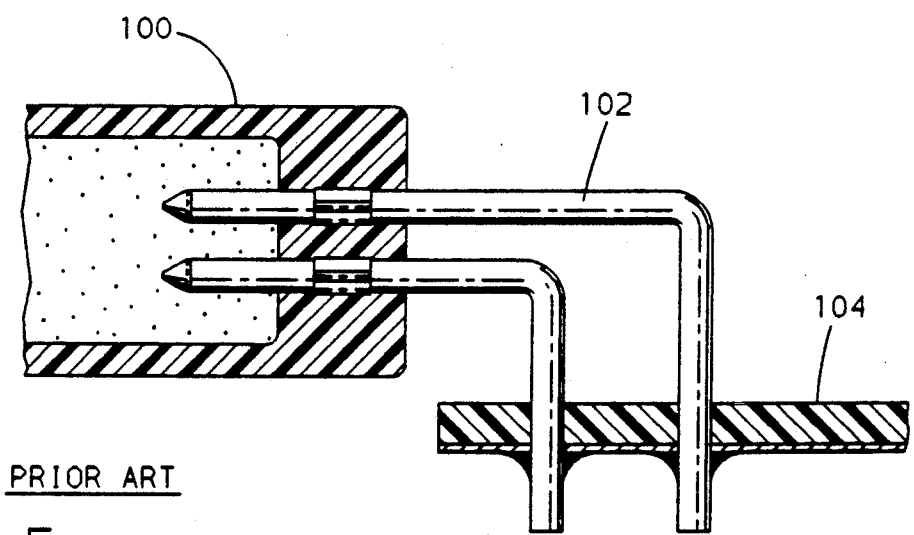
FIG. 5 is an illustration of a wirebond pin of the prior art inserted into a circuit board.

FIG. 5 is a sectional view of a connection pin 102 of the prior art inserted into a plastic header 100 and soldered to a fiberglass circuit board 104. The formed pin must be soldered to the circuit board for mechanical and electrical integrity. The use of formed pins to make an electrical connection from a semiconductor device to the outside world is not practical for a ceramic substrate. In order for such a formed pin to be utilized with the ceramic substrate, attempts would have to be made to place a hole in the ceramic substrate. Attempts to place a hole in ceramic substrate would likely result in breaking or severely damaging the substrate. Further, ceramics are often used in environments which subject them to low and high temperatures (−50° to 150° C.) and thermal expansion. The difference in the coefficient of thermal expansion of the pin verses the ceramic for practical purpose eliminates the possibility of using a ceramic having a hole filled with a connector pin.

Figure 6:
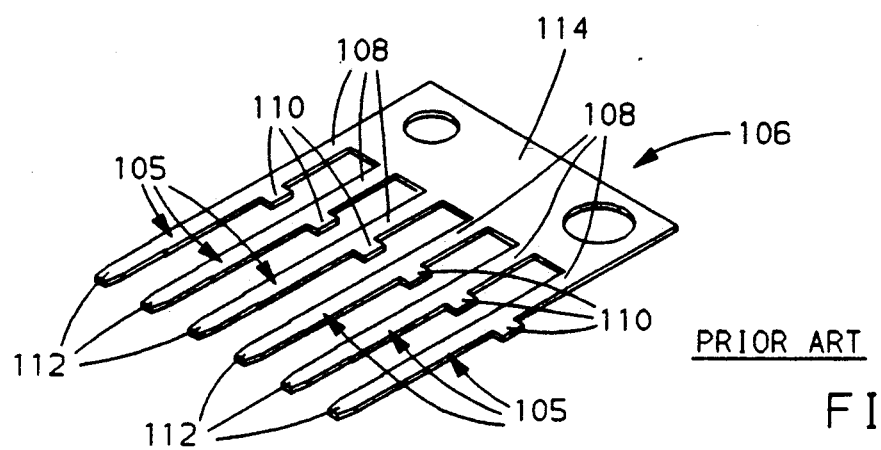
FIG. 6 is an illustration of a lead frame electrical connection of the prior art.

Lead frame interconnector pins are known. These lead frame pins are stamped or cut out of a single sheet of metal. FIG. 6 illustrates such lead frame interconnector pins 106. Generally these lead frames include a plurality of pins 105 each having an electrical interconnecting portion 112, a locking tab 110 and a surface 108 for wirebonding. Upon molding a plastic header around the lead frame, the locking tab prevents the lead frame pins from being pulled out of the plastic header. The lead frame also includes a base portion 114 which holds the pins together. After the lead frame is molded in a plastic header the base portion is cut off at the surface for wirebonding 108 to leave individual leads embedded in the plastic header. A disadvantage to a lead frame interconnection is that the spacing or pitch between the longitudinal axis of adjacent pins is relatively large and on the order of 3.5 mm or larger. This is because the tooling used to cut the lead frame requires substantial spacing between the leads and other features in order to accurately cut the lead frame. Further, as is illustrated in FIG. 6, the locking tab also limits how closely the leads can be positioned with respect to each other.

Figure 4:
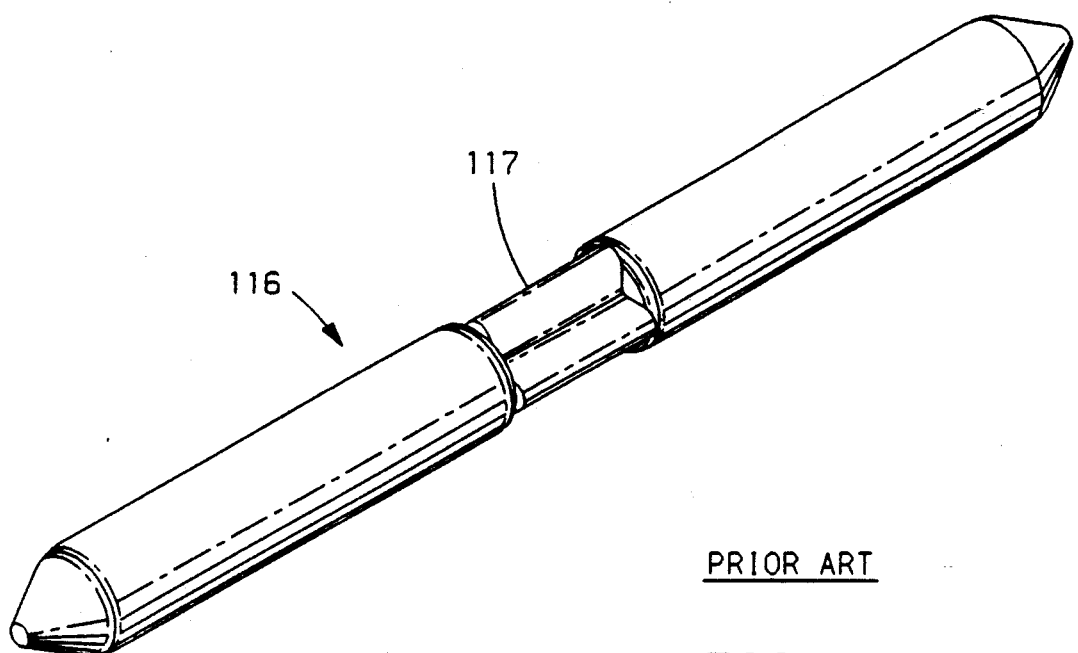
FIG. 4 is an illustration of a wirebond pin of the prior art.

FIG. 4 shows another prior art wirebond pin 116 including a star-shaped anchor portion 117. When such a wirebond-pin is used to make enclosed modular semiconductor devices, the assembly process must include a step for sealing off the gap between the surface of the plastic defining the hole and the shaft of the pin. If the hole is not sealed off, passivation material used to protect the semiconductor device will leak out through the plastic header.

Figure 1:
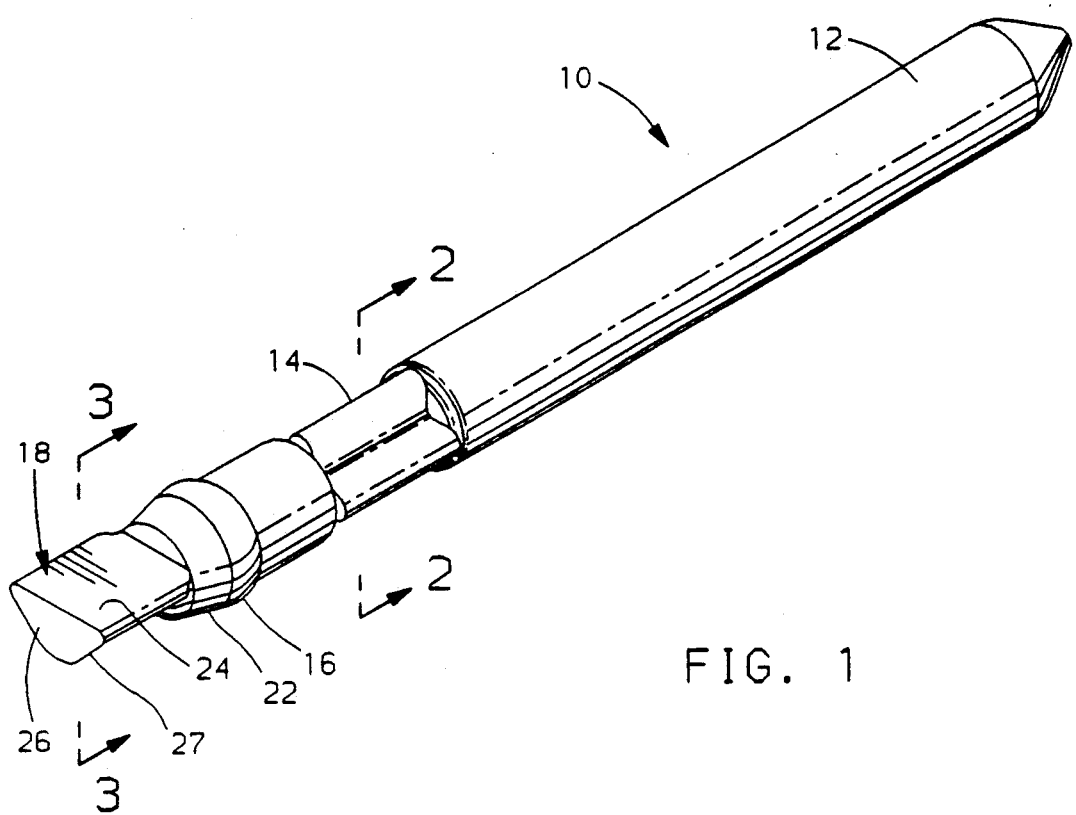
FIG. 1 is an illustration of a wirebond pin according to the present invention.

FIG. 1 shows a single piece wirebond pin 10 according to the present invention. The wirebond pin includes a contact portion 12 for electrically connecting to power sources or other electrical components. The pin includes an anchor portion 14 which may have a star shape. The anchor portion rigidly secures the pin in a plastic header and prevents movement of the pin. A collar portion 16 is spaced a distance from the anchor portion so that when the pin is inserted into a hole formed or molded in a plastic header, the collar portion seals any gap between the plastic header defining the hole and the shaft of the wirebond pin. A paddle 18 is positioned adjacent the collar and has a substantially flat surface for ultrasonic wirebonding to the same.

The pin may be made out of phosphous-bronze, copper, nickel, brass or any suitable conduction material, and is preferably made out of brass. Preferably, the pin is extruded or formed from a brass material in a manner known in the art. The length of the pin may vary for various applications, but preferably ranges from about 15.55 millimeters (mm) to about 18.10 mm. The shaft 20 of the pin has a diameter ranging from about 1.00 mm to about 1.06 mm.

Figure 2:
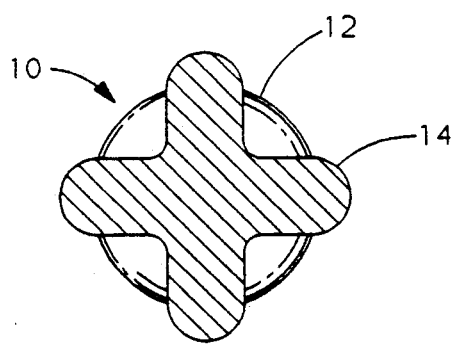
FIG. 2 is a sectional view taken along line 2—2 of FIG. 1.
Figure 3:
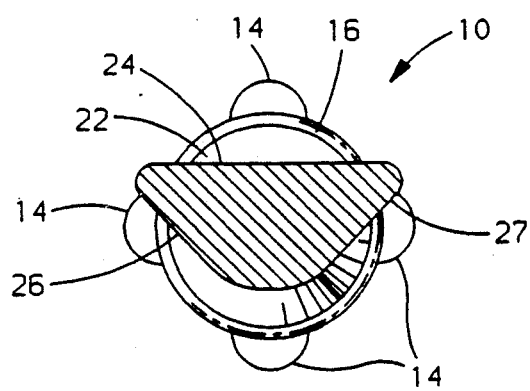
FIG. 3 is a sectional view taken along line 3—3 of FIG. 1.

The star-shaped anchor portion of the pin has a length ranging from about 1.85 mm to about 2.15 mm and preferably 2.0 mm. The diameter of the star-shaped portion may range from about 1.20 mm to about 1.30 mm and is preferably about 1.25 mm. As shown in FIG. 2, the diameter of the star-shaped anchor is greater than the diameter of the shaft of the pin. Each blade of the star-shaped anchor may have a width of 0.35 mm.

Preferably the collar is positioned a distance ranging from about 0.83 mm to about 1.13 mm and preferably 0.97 mm from the star-shaped anchor. The collar may have a diameter ranging from about 1.175 mm to about 1.225 mm and preferably 1.20 mm. The width of the collar may range from about 0.25 mm to about 0.55 mm and most preferably 0.40 mm. A chamfered portion 22 may extend downward from the collar to the paddle.

The paddle preferably has a flat surface 24 which has a width ranging from about 1.00 mm to about 1.6 mm and preferably 1.3 mm. Most preferably, the paddle has a flat platform section for wirebonding and two sides 26, 27 which converge on one another. Preferably the top platform surface 24 has a width greater than the diameter of the pin shaft and the two sides 26, 27 have equal widths. The length of the top surface 24 of the paddle may range from about 2.03 mm to about 2.13 mm and is preferably 2.08 mm. The paddle may be plated with a material such as nickel to improve wirebonding.

The pin may be inserted into a plastic header 28 (FIGS. 7-9) which may be made from any resilient material but is preferably polyester and 30% glass. A suitable material for preparing the plastic header is available from Celanese Corporation under the trade name CELANEX 3300D. The pin is inserted into the plastic header with the electrical connection portion first.

Figure 7:
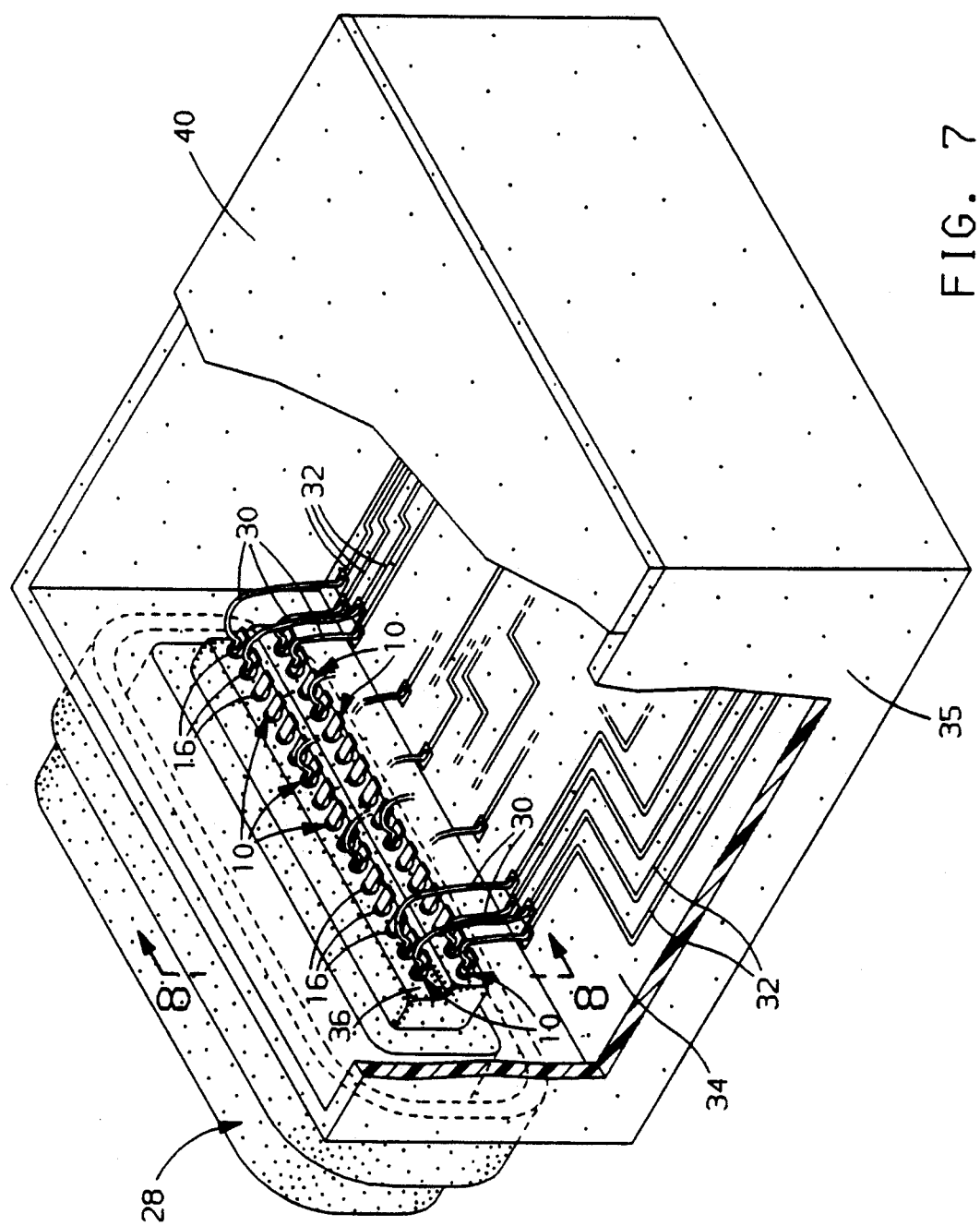
FIG. 7 is a perspective view of an electric device having a wirebond pin/plastic header combination according to the present invention.
Figure 8:
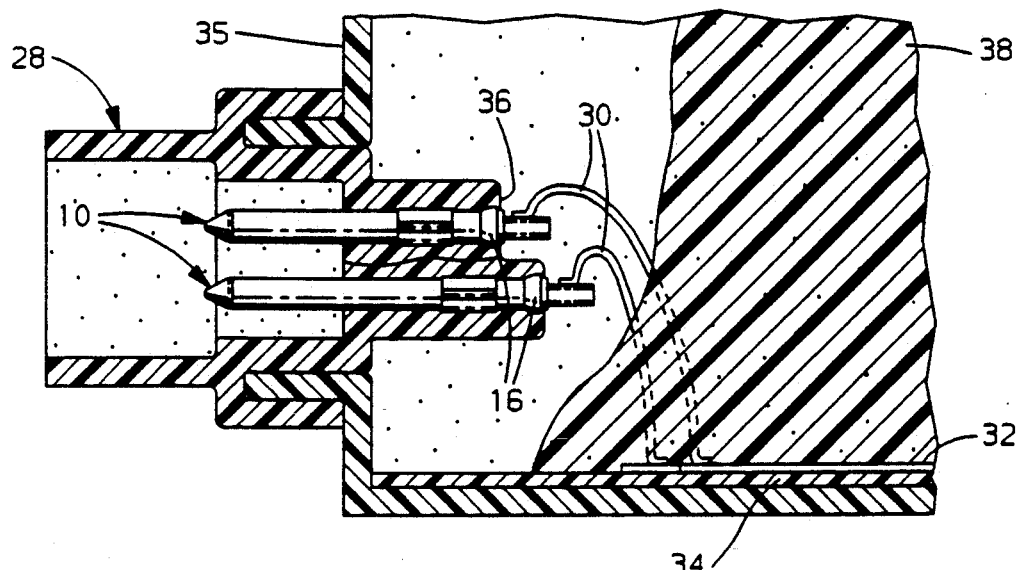
FIG. 8 is a sectional view of the wirebond pin inserted in a plastic header and electrically connected to a semiconductor device which has a layer of liquid passivation material overlying the same.
Figure 9:
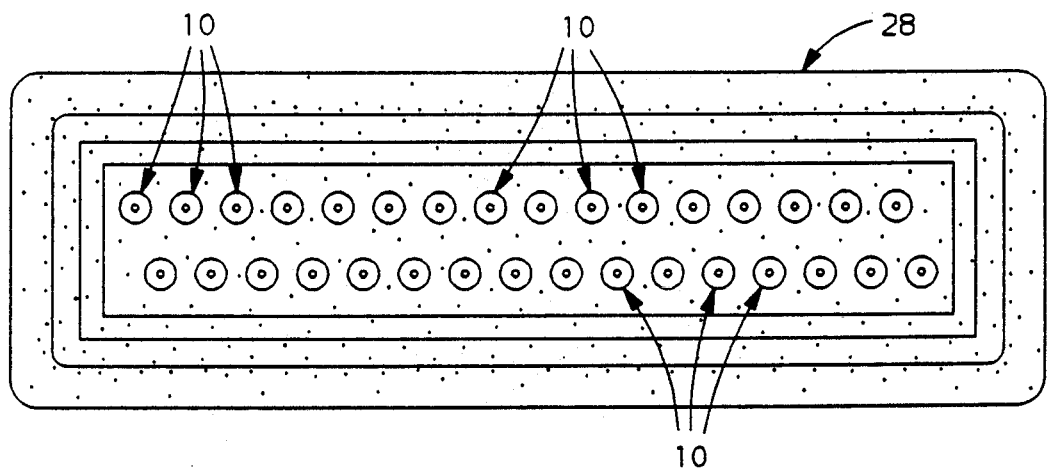
FIG. 9 is an end view illustration of a wirebond pin plastic header combination according to the present invention.

FIGS. 7 and 9 show the wirebond pin 10 of the present invention secured in a plastic header 28 and having a wire 30 bonded to the paddle of the pin at one end and to a semiconductor device 32 or hybrid ceramic circuit at the other end. The semiconductor device may be carried by a substrate 34 and received in a housing 35. The collar 16 may abut the front face 36 of the header or preferably at least a portion or all of the collar extends into the hole formed in the plastic header to seal the hole off. The collar operates to rigidly secure the pin in the plastic header and to eliminate the resonant vibration of the pin during ultrasonic wirebonding. Further, the collar operates to completely seal off any gap between the surface of the plastic defining the hole and the shaft of the pin. Thus, the collar prevents leakage of the passivation layer material 38 out of the device. Should the passivation material leak out during the assembly process, it would have to be cleaned from the assembly equipment before other parts could be processed. Also, leakage of the passivation material would subject the device to attack from environmental agents and possibly reduce yields. A cap or cover 40 may be placed on top of the housing to seal off the semiconductor device or hybrid circuit.

FIG. 9 illustrates an end view of a plastic header 28 having first and second substantially straight rows of pins 10 according to the present invention. The pins may be arranged such that the longitudinal axis of each pin is spaced apart from an adjacent pin a distance of about 1.5 mm.

Figure 10:
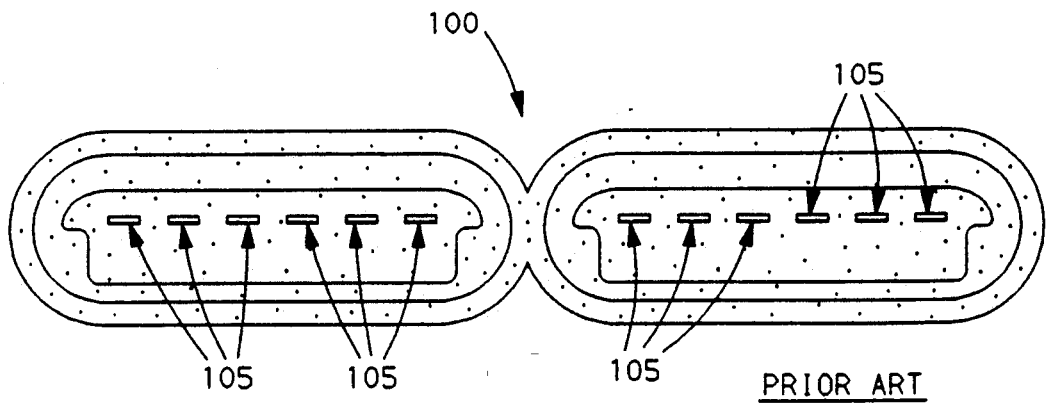
FIG. 10 is an end view illustration of a lead frame electrical connection/plastic header combination of the prior art.

FIG. 10 is an end view illustration of a plastic header 100 having twelve lead frame leads 105 molded therein according to the prior art. The prior art lead frame construction limits the spacing of pins such that the longitudinal axis of adjacent pins must be at least 3.5 mm. Upon comparing FIGS. 9 and 10, it will become apparent that for substantially the same header space, 32 pins may be inserted into the header using the pin of the present invention as compared to only 12 leads of the prior art.

In the manufacture of a modular semiconductor device according to the present invention, an integrated circuit is placed on a ceramic substrate. The ceramic substrate is secured to an aluminum housing. A wirebond pin/plastic header combination according to the present invention is attached to the housing. Wire connections are made from the pin paddles down to the hybrid circuit on the substrate by ultrasonic bonding. Thereafter, a passivation material is poured over the ceramic substrate to completely seal off the ceramic circuit, wires and wirebond pins. The passivation layer protects the integrated circuit and its electrical connection from contamination by external materials. Then the passivation material is cured in an oven and a cap or cover is adhered to the housing to seal off the electronic component.

The following is an illustration of the utility of the pin according to the present invention. A pin has an electrical connection portion on one end, a paddle on the other end, an anchor adjacent the electrical connection portion, a collar adjacent the paddle and a middle portion extending between the anchor and the collar. Preferably the electrical connection portion and the middle portion have equal diameters. The collar has a diameter greater than the middle portion and preferably equal to or greater than the diameter of the anchor. A preferred pin has a shaft diameter (middle portion and electrical connection portion) of 1 mm, a blade diameter (or width) of 1.25 mm and a collar diameter of 1.25 mm. Such a pin may be inserted into a hole in a plastic header having a diameter of about 1.04 mm to about 1.09 mm with the electrical connection portion going in first. As the star-shaped anchor portion moves through the plastic header it must deform the plastic header to accommodate the blade diameter of 1.25 mm. However, as the star-shaped anchor goes through a section of the plastic header, the plastic flexes back to provide a hole which is approximately 1.15 mm in diameter. However, since the diameter of the shaft portion of the pin is only 1.00 mm, the collar having a diameter of 1.25 mm engages at least the face of the header to close the 1.15 mm hole left by the star-shaped anchor and the original hole having a 1.04 mm to 1.09 mm diameter.

Using the wirebond pin according to the present invention, it is possible to make a 32-pin interconnect from a plastic header having the dimensions of 3.5 mm by 46.50 mm.

The embodiments of the invention in which an exclusive property or privilege is claimed are defined as follows:

1. An electrical device comprising:
   a plastic header and a wirebond pin;
   said plastic header having top, bottom, front and back faces;
   said wirebond pin comprising a shaft having an electrical connection portion at one end and a paddle at the other end, a collar adjacent the paddle, an anchor adjacent said electrical connection portion and a middle portion extending between said anchor and said collar, said anchor having a diameter greater than said middle portion;
   said pin being received in a hole formed in said header and having a diameter greater than said pin middle portion so that at least a portion of said electrical connection extends outward from said back face, said anchor being fixed in and surrounded in said plastic, said middle portion and said plastic defining a circular void extending the longitudinal axis of said middle portion from said anchor to said front face, and so that said circular void is sealed by said collar,
   a wire having one end ultrasonically bonded to the paddle and the other end ultrasonically bonded to a semiconductor device on a substrate in fixed relationship to the plastic header,
   a passivation material encapsulating the semiconductor device, wire paddle and a portion of the front face of header.

2. An electrical device as set forth in claim 1 comprising a plurality of wirebond pins similarly received in said plastic header.

3. An electrical device as set forth in claim 2 wherein at least two adjacent pins have longitudinal axes, center to center, that are spaced a distance from each other less than 3.0 mm.

4. An electrical device as set forth in claim 2 wherein at least two adjacent pins have longitudinal axes that are spaced a distance from each other ranging from about 2.85 mm to about 3.65 mm.

5. An electrical device as set forth in claim 2 wherein at least two adjacent pins have longitudinal axes that are spaced a distance from each of about 1.5 mm.

6. An electrical device as set forth in claim 2 comprising first and second rows of pins wherein adjacent pins in each row have longitudinal axes that are spaced a distance from each other ranging from about 1.35 mm to about 1.65 mm.

7. An electric device as set forth in claim 5 wherein said first and second rows of pins are substantially parallel and each having 16 pins.

8. A method of using a wirebond pin comprising a shaft having an electrical connection portion at one end and a paddle at the other end, a collar adjacent the paddle, an anchor adjacent said electrical connection portion and a middle portion extending between said anchor and collar, and said anchor having a diameter greater than said middle portion, comprising the steps of:
   providing a plastic header having top, bottom, front and back faces, and a hole through said header extending from said front face to said back face and having a diameter greater than the diameter of said pin middle portion;
   inserting said electrical connection pin into said plastic header so that said electrical connection portion first enters said front face and continuing through towards said back face so that at least a portion of said electrical connection extends outward from said back face and is exposed, said anchor is fixed and surrounded by plastic, said middle portion is received in said hole, said middle portion and said plastic defining a circular void extending from said anchor to said front face, and so that said collar seals off said circular void,
   ultrasonically bonding one end of a wire to the paddle and ultrasonically bonding the other end of a wire to a semiconductor device on a substrate in a fixed relationship to the header,
   encapsulating the semiconductor device, wire, paddle and a portion of the front face of the header with a liquid passivation material and so that the collar prevents the flow of the liquid passivation through the void defined by the header and the middle portion of the pin.

9. A method of wirebonding as set forth in claim 8 wherein said paddle comprises a substantially flat top face having sufficient surface area for bonding said wire thereto, and a pair of sides each extending downward from said paddle top face and converging on each other.

10. A method as set forth in claim 9 wherein said paddle top face and sides have equal lengths and widths.

11. A method as set forth in claim 8 wherein said collar is positioned a distance from said anchor ranging from about 0.83 mm to about 1.13 mm.

12. A method of making a semiconductor device comprising:
preparing a circuit on a ceramic substrate;
placing the ceramic substrate in a housing comprising a bottom floor and four upright walls;
providing a single piece wirebond pin comprising a shaft having an electrical connection portion at one end and a paddle at the other end, a collar position adjacent said paddle, a star-shaped anchor positioned a distance from said collar on said shaft and a middle portion extending between said anchor and said collar;
providing a plastic header having top, bottom, front and back faces, and a hole through said header extending from said front face to said back face and having a diameter greater than said middle portion of said pin;
said middle portion and a surface in said header defining a circular void extending the longitudinal axis of said middle portion;
inserting said pin into the header, with the electrical connector portion first, and so that said collar abuts said plastic header and seals off said circular void;
attaching said plastic header to said housing so that said paddle extends into the cavity of the housing defined by the bottom face and four upright walls;
ultrasonic bonding one end of a wire to said paddle and the other end to said circuit;
pouring a liquid passivation material into the cavity of the housing to completely cover said ceramic substrate, paddle and bonded wire and so that the pin collar prevents the liquid passivation material from flowing through said circular void;
curing said passivation layer; and
securing a cap to said housing.

* * * * *